(12) United States Patent
Nguyen et al.

(10) Patent No.: US 7,663,939 B2
(45) Date of Patent: Feb. 16, 2010

(54) VOLTAGE STABILIZER MEMORY MODULE

(75) Inventors: Henry Nguyen, Fountain Valley, CA (US); Ngoc Le, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 11/442,818

(22) Filed: May 30, 2006

(65) Prior Publication Data

US 2007/0280010 A1    Dec. 6, 2007

(51) Int. Cl.
*G11C 7/00* (2006.01)
(52) U.S. Cl. .................. 365/189.11; 365/222
(58) Field of Classification Search .......... 365/189.11
See application file for complete search history.

(56) References Cited

U.S. PATENT DOCUMENTS 6,751,113 B2    6/2004  Bhakta et al.
6,856,556 B1 *  2/2005  Hajeck ............... 365/189.11
2006/0206673 A1 * 9/2006  Lu et al. ................. 711/154
2006/0245254 A1 * 11/2006 Ishii et al. ............ 365/185.18

\* cited by examiner

*Primary Examiner*—Hoai V Ho
*Assistant Examiner*—Jason Lappas
(74) *Attorney, Agent, or Firm*—Sawyer Law Group, P.C.

(57) ABSTRACT

A memory module is disclosed. The memory module comprises a voltage supply; a memory interface coupled to the voltage supply; a plurality of memory components; and a voltage stabilizer converter (VSC) coupled to the memory interface and to the plurality of memory components, the VSC for ensuring that the plurality of memory components operate at their optimum performance level. A voltage stabilizer memory module (VSMM) in accordance with the present invention includes a printed circuit board (PCB) that contains memory chips, discrete components, a voltage stabilizer converter, and other related components. The voltage stabilizer converter uses system voltage supply as its input and its output is the voltage supply for the DRAM components. Accordingly, the VSSM is more adaptable, more stable and has better performance than conventional memory modules.

12 Claims, 3 Drawing Sheets

10

100

VOLTAGE STABILIZER MEMORY MODULE

FIELD OF THE INVENTION

The present invention relates generally to memory modules and more specifically to providing a stabilized voltage to components of the memory module.

BACKGROUND OF THE INVENTION

Memory modules are utilized in a variety of devices, such as computers, cell phones, PDAs, media players, MP3 players and the like to provide additional storage for such devices. FIG. 1 illustrates a device 5 that includes a function circuitry 7 which is coupled to at least one memory module 10. FIG. 2 is a block diagram of a conventional memory module 10. As shown in FIG. 1, the module 10 interfaces through memory bus interface 12 with conventional memory module 10. The memory module 10 includes DRAM chips 11-19, a memory bus interface 22, a serial present detect (SPD) ROM chip 20, a printed circuit board (PCB) 23 and discrete components (not shown). The supply voltage 24 is supplied by the system through the memory bus interface 22 to all DRAM components 11 through 19.

The memory module 10 is a narrow printed circuit board that typically comprises multiple memory chips, typically dynamic RAM (DRAM) or synchronous dynamic RAM (SDRAM) or double data rate (DDR, DDR2, DDR3). The performance of one memory module is based on PCB design and electrical characteristics of memory chips. One of the parameters of electrical characteristics of memory chips that affects the performance of the memory module is the supply voltage to the memory components.

The common operating voltage condition of the memory module 10 depends on the memory technology For example, a DDR2 module has an operating voltage supply of 1.8 volt+/−5%. The operating voltage of DDR1 266 and DDR1 333 modules is 2.5 V=/−8%, and a DDR1 400 memory module has an operating voltage of 2.6+/−4%. The memory modules may encounter memory error that causes system data errors if their operating voltage falls below the lower range of the operating voltage. In general, the memory module will still perform well if the voltage supply swings higher than the upper range of the supply voltage. Accordingly, a conventional memory module's performance depends on how good the system voltage source supply is; therefore, one module can work on one system but fail on another. In addition, as is seen all of the DRAM components receive the same voltage from the voltage supply 24. Therefore, if the DRAM components 11-19 require different voltage levels for optimum performance the conventional memory module is not adequate.

Accordingly, what is needed is a system and method for overcoming the above-identified issues. The present invention addresses such a need.

SUMMARY OF THE INVENTION

A memory module is disclosed. The memory module comprises a voltage supply; a memory interface coupled to the voltage supply; a plurality of memory components; and a voltage stabilizer converter (VSC) coupled to the memory interface and to the plurality of memory components, the VSC for ensuring that the plurality of memory components operate at their optimum performance level. A voltage stabilizer memory module (VSMM) in accordance with the present invention includes a printed circuit board (PCB) that contains memory chips, discrete components, a voltage stabilizer converter, and other related components. The voltage stabilizer converter uses system voltage supply as its input and its output is the voltage supply for the DRAM components. Accordingly, the VSSM is more adaptable, more stable and has better performance than conventional memory modules.

DETAILED DESCRIPTION

The present invention relates generally to memory modules and more specifically to providing a stabilized voltage to components of the memory module. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A voltage stabilizer memory module (VSMM) in accordance with the present invention includes a printed circuit board (PCB) that contains memory chips, discrete components, a voltage stabilizer converter, and other related components. The voltage stabilizer converter uses system voltage supply as its input and its output is the voltage supply for the DRAM components. For example, the input of the voltage stabilizer converter can vary from 1.65 volts up to 5.5V and the output of a voltage stabilizer converter can be adjusted at a level between 1.8V and 5.5V to support the VSMM. To describe the features of the present invention in more detail, refer now to the following description in conjunction with the accompanying Figures.

Figure 1:
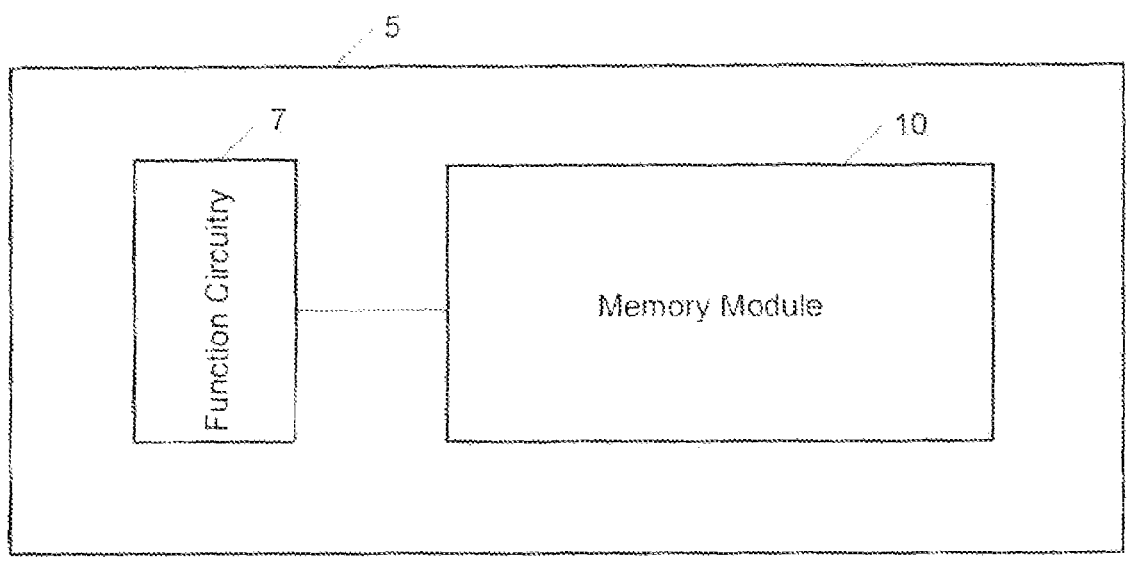
FIG. 1 is a block diagram of a device that includes a memory module.
Figure 2:
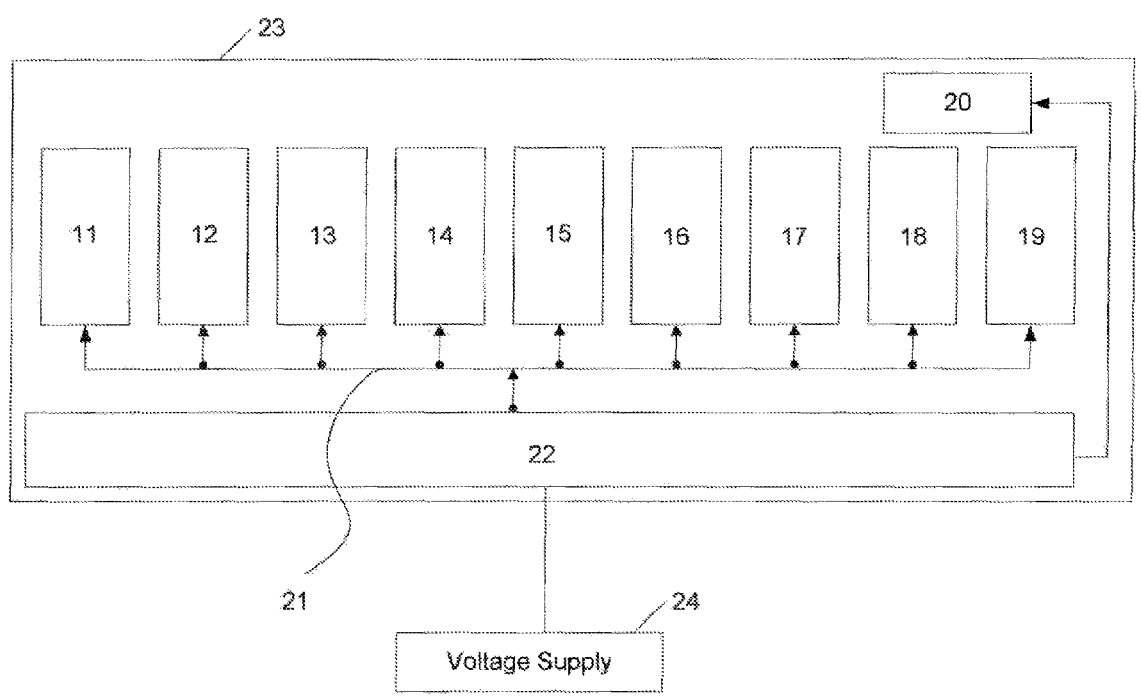
FIG. 2 is a block diagram of a conventional memory module.
Figure 3:
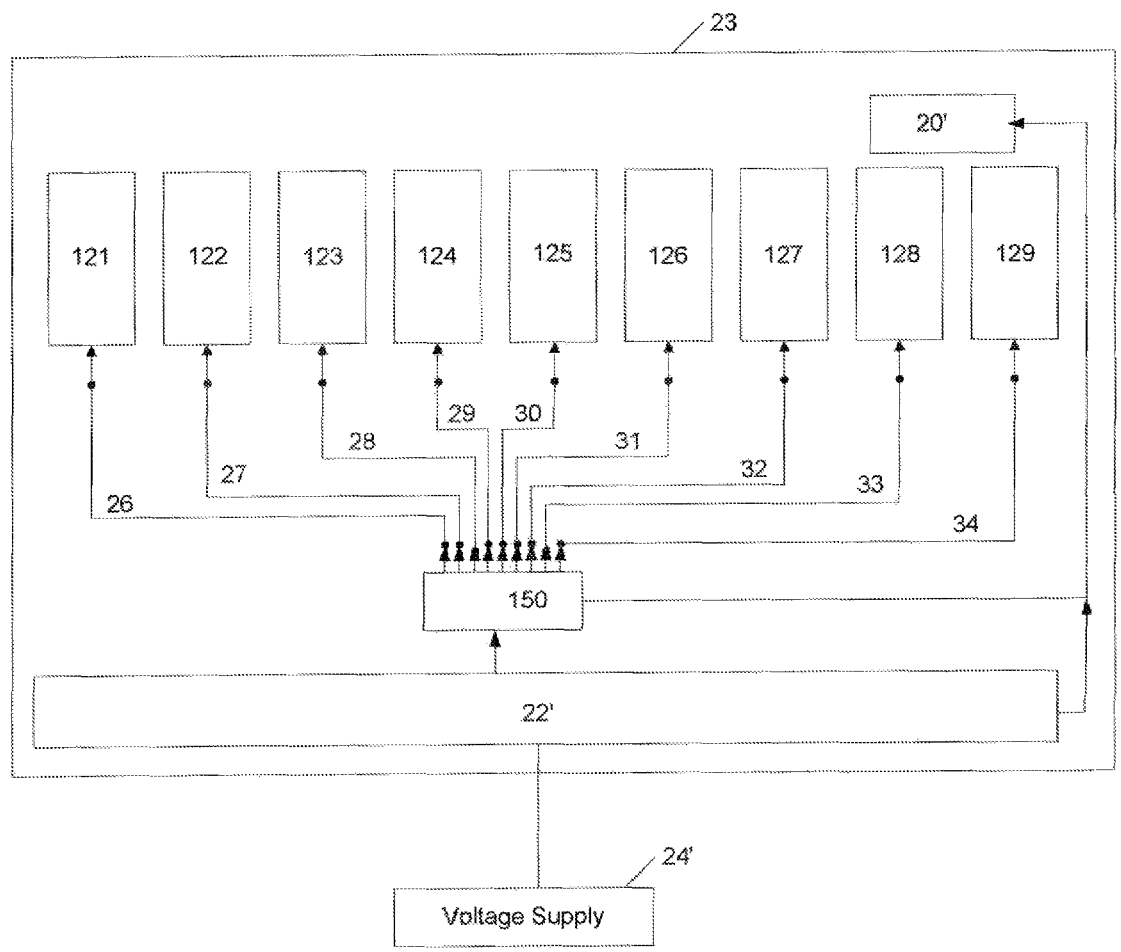
FIG. 3 is a voltage stabilizer memory module in accordance with the present invention.

FIG. 3 is a voltage stabilizer memory module (VSMM) 100 in accordance with the present invention that could be utilized in a variety of devices. The VSMM 100 comprises of DRAM components 121-129, a memory bus interface 22', a serial present detect (SPD) ROM chip 20', a voltage stabilizer converter (VSC) 150, a PCB 23 and discrete components (not shown). The DRAM chips can be identical but could also be of different types depending on the implementation. The supply voltage 24' is supplied by the system through the memory bus interface 22' to voltage stabilizer converter (VSC) 150. The VSC 150 in turn can individually boost the voltage of each of the DRAM components 121-129 via signals 26-34 to achieve the optimal performance for each of the DRAM components 121 through 129 respectively. To prevent the unwanted voltage drop of the supply voltage to the memory module, the VSC 150 is provided within the memory module. The VSC 150 uses the system voltage supply as its source and act as a power supply. Regardless of the voltage tolerance level of the operating system supply voltage, this circuit will keep the voltage level supply to the memory chips as defined. The difference between the conventional VSMM and a traditional memory module is that the VSMM will use the system voltage supply as its own power source for its voltage stabilizer converter and output its own voltage to supply the whole module.

The VSC 150 can be adjusted manually based upon performance of the DRAM components. In another embodiment the converter can read off manufacturer specific data from the serial present detect (SPD) ROM chip 13'. The proper input voltage levels are calibrated in the factory during the manufacturing process and stored in the SPD 20' for use in later field operation. A circuit which could be utilized as the VSC 150 is a synchronous boost converter such as model number TP61030 manufactured by Texas Instruments.

Regardless of the level of the supply voltage 24', the VSC 150 is preset with the optimal output voltage to levels 26 through 34 supplied to each corresponding DRAM chip 121 through 129. Accordingly, the VSMM's performance is based on the output of the VSC 150 being configured to a certain voltage level that is not affected by the change in voltage of the system.

The VSMM has the following advantages over conventional memory modules.

1. Stability. Memory module stability is improved because the VSMM will work under preset voltages other than using the system power supply source directly, which can fluctuate and is not as stable.

2. Adaptability. Memory DRAM functions better at positive voltage swing. This can be accomplished on the VSMM since the supply voltage to the DRAMs can be adjusted by the manufacturer instead of by the system or the user, neither of which have first-hand knowledge about the nature of the DRAM components.

3. Performance. The operating voltage can be manually preset or automatically adjusted to match the performance of each individual or all DRAM chips on the module, thereby achieving the maximum performance possible based on the components used.

Although the present invention has been described in accordance with the embodiments shown, one of ordinary skill in the art will readily recognize that there could be variations to the embodiments and those variations would be within the spirit and scope of the present invention. For example, although DRAM components are described in the embodiment shown in FIG. 3, a plurality of memory components can be utilized and their use would be within the spirit and scope of the present invention. Accordingly, many modifications may be made by one of ordinary skill in the art without departing from the spirit and scope of the appended claims.

What is claimed is:

1. A memory module comprising:
    a voltage supply for supplying voltage to other components of the module;
    a memory interface coupled to the voltage supply
    a plurality of memory components; and
    a voltage stabilizer converter (VSC) coupled to the memory interface and to the plurality of memory components, the VSC for ensuring that the plurality of memory components operate at their optimum performance level, wherein the VSC provides an individual signal to each of the memory components to individually boost the voltage of each of the memory components to ensure that each of the memory components operate at their optimum levels; wherein the VSC is preset with the optimal output voltage supplied to each corresponding DRAM chip, wherein each individual optimal output voltage level may vary according to the voltage level required of each individual DRAM chip.

2. The memory module of claim 1 wherein the VSC boosts the voltage supplied to the plurality of memory components to ensure that the memory components operate at their optimum level.

3. The memory module of claim 1 wherein the memory components comprise DRAM components.

4. The memory module of claim 1 which includes a serial present detect (SPD) ROM coupled to the memory interface, wherein the SPD provides information about each of the memory components to the memory interface to allow the VSC to provide the optimum voltage to each of the memory components.

5. The memory module of claim 1 wherein the VSC comprises a synchronous boost converter.

6. A device comprising:
    a function circuit; and
    a memory module coupled to the function circuit, the memory module comprising a voltage supply for supplying voltage to other components of the module; a memory interface coupled to the voltage supply; a plurality of memory components; and a voltage supplier converter (VSC) coupled to the memory interface and to the plurality of components, the VSC for ensuring that the plurality of memory components operate at their optimum performance level, wherein the VSC provides an individual signal to each of the memory components to individually boost the voltage of each of the memory components to ensure that each of the memory components operate at their optimum levels; wherein the VSC is preset with the optimal output voltage supplied to each corresponding DRAM chip, wherein each individual optimal output voltage level may vary according to the voltage level required of each individual DRAM chip.

7. The device of claim 6 wherein the VSC boosts the voltage supplied to the plurality of memory components to ensure that the memory components operate at their optimum level.

8. The device of claim 6 wherein the memory components comprise DRAM components.

9. The device of claim 6 which includes a serial present detect (SPD) ROM coupled to the memory interface, wherein the SPD ROM provides information about each of the memory components to the memory interface to allow the VSC to provide the optimum voltage to each of the memory components.

10. The device of claim 6 wherein the VSC comprises a synchronous boost converter.

11. A memory module comprising:
    a voltage supply for supplying voltage to other components of the module;
    a memory interface coupled to the voltage supply;
    a plurality of DRAM components; and
    a voltage stabilizer converter (VSC) coupled to the memory interface and to the plurality of memory components, the VSC for ensuring that the plurality of memory components operate at their optimum performance level; wherein the VSC provides an individual signal to each of the memory components to individually boost the voltage of each of the memory components to ensure that each of the memory components operate at their optimum levels; wherein the VSC is preset with the optimal output voltage supplied to each corresponding DRAM chip, wherein each individual optimal output voltage level may vary according to the voltage level required of each individual DRAM chip.

12. The memory module of claim 11 which includes a serial present detect (SPD) ROM coupled to the memory interface, wherein the SPD provides information about each of the memory components to the memory interface to allow the VSC to provide the optimum voltage to each of the memory components.

* * * * *